(12) United States Patent
Clark et al.

(10) Patent No.: US 8,405,532 B1
(45) Date of Patent: Mar. 26, 2013

(54) ASYNCHRONOUS SAMPLE RATE CONVERTER

(75) Inventors: Brian Clark, Lincoln, CA (US); Dana Massie, Santa Cruz, CA (US)

(73) Assignee: Audience, Inc., Mountain View, CA (US)

( * ) Notice: Subject to any disclaimer, the term of this patent is extended or adjusted under 35 U.S.C. 154(b) by 321 days.

(21) Appl. No.: 12/790,552

(22) Filed: May 28, 2010

Related U.S. Application Data

(60) Provisional application No. 61/181,988, filed on May 28, 2009.

(51) Int. Cl.
*H03M 7/00* (2006.01)

(52) U.S. Cl. .......................................... 341/61; 708/300

(58) Field of Classification Search .................... 341/61, 341/122, 123, 124; 375/375, 376, 344, 350, 375/222, 232; 708/313, 300, 301, 303, 305, 708/306
See application file for complete search history.

(56) References Cited

U.S. PATENT DOCUMENTS 6,279,019 B1 * 8/2001 Oh et al. ...................... 708/300

* cited by examiner

*Primary Examiner* — Joseph Lauture
(74) *Attorney, Agent, or Firm* — Carr & Ferrell LLP

(57) ABSTRACT

Systems and methods for asynchronous sample rate conversion are provided that allow time-varying arbitrary sample ratios. An uncorrected ratio between two arbitrary sample rates is corrected and subsequently used to perform an efficient sample rate conversion on the samples in a data stream. Coefficients of a (polyphase) finite impulse response filter are interpolated based on a current time register value. Additional computational efficiency (and a smaller finite impulse response filter) may be used due to oversampling the input signal to the finite impulse response filter.

22 Claims, 9 Drawing Sheets

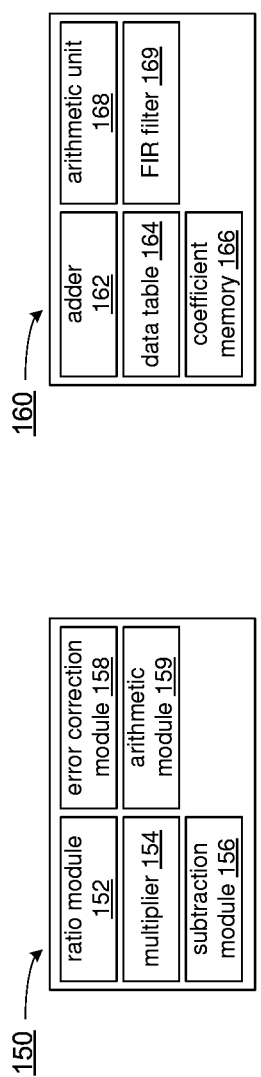

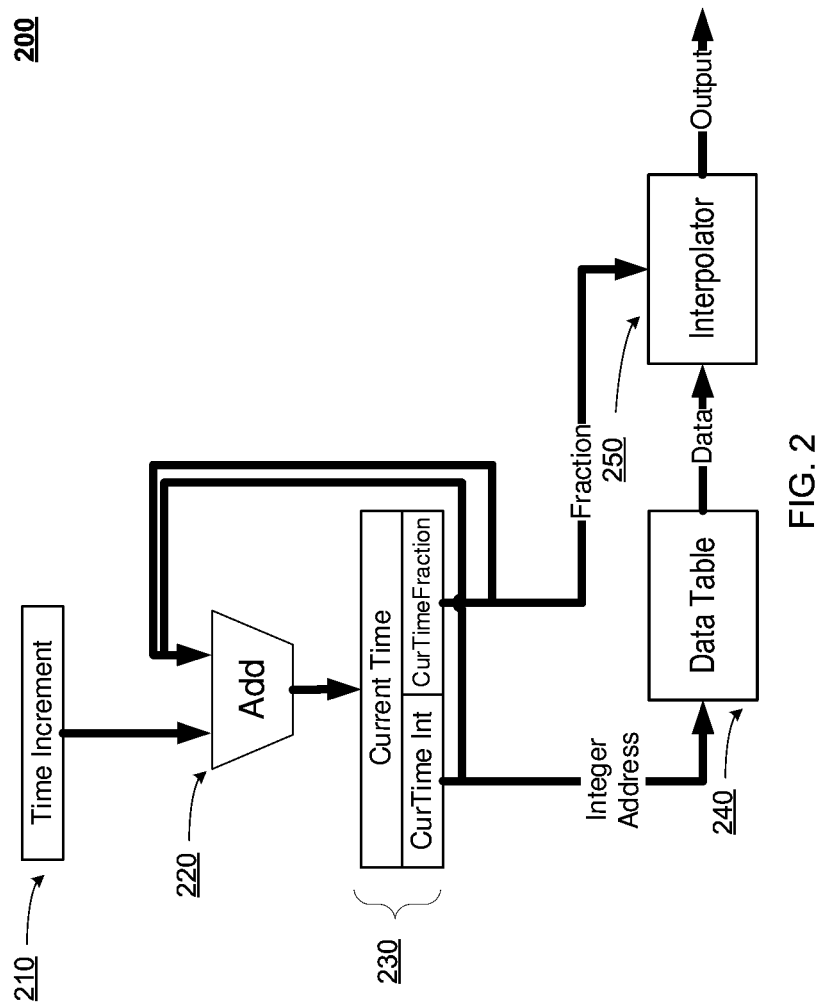

ASYNCHRONOUS SAMPLE RATE CONVERTER

CROSS REFERENCE TO RELATED APPLICATIONS

This application claims the benefit of U.S. Provisional Application No. 61/181,988, filed on May 28, 2009, which is hereby incorporated herein by reference in its entirety.

BACKGROUND

Audio signals are frequently communicated in a digital format as a sequence of digital numbers, as in common consumer products such as the Compact Disc player, or in mobile phones, which convert analog audio to digital audio data streams for transmission over mobile telephone networks.

It is often necessary to combine two digital audio data streams to provide a combined input audio data signal. This process of adding multiple audio data streams is commonly called "mixing." In order to mix or add together two or more input digital audio data streams, the input audio data streams must be at the same sample rate, or the resulting audio sum will be distorted.

However, in many cases where two or more digital audio data streams are to be mixed, the incoming digital audio data streams are not at the same sample rate. The original sample rate of the audio may have been generated or recorded at different sample rates, such as 48,000 samples per second for high fidelity audio, and 8,000 samples per second for telephone quality audio.

Even if the original audio sources were generated at the same nominal sample rate, the crystal oscillators commonly used for clocking audio data have some error or drift. Usually inexpensive crystal oscillators may drift by 1 part in 10,000 or 100 parts per million (PPM).

Therefore, a process known as asynchronous sample rate conversion can be performed on one or more of the input data streams. Asynchronous sample rate conversion converts the sample rate of a first data stream to the sample rate of another data stream to be mixed with the first data stream.

It is also possible to mix two audio data streams by converting the data streams to analog voltages using two Digital-to-Analog convertors (DACs), and then summing together the two analog signals. However, the processing and time costs of using the two DACs can be greater than the processing and time costs of performing the sample rate conversion operation in the digital domain. If done properly, the quality of digital sample rate conversion will exceed the quality of summation of two input signals in the analog domain.

What is needed is a system for mixing two audio data streams having independent and asynchronous sample rates in an efficient manner.

SUMMARY OF THE INVENTION

In some embodiments, the present technology provides methods and systems for calculating a corrected ratio of two time increment values, allowing both arbitrary ratios between sample rates as well as time-varying arbitrary ratios between sample rates. A time increment value, or time delta, is derived by determining the difference between consecutive time stamps of an incoming data stream or clock signal. Embodiments may calculate an uncorrected ratio between a first time increment value and a second time increment value. An error value may be produced by subtracting an uncorrected increment value from the second time increment value. The uncorrected value may be updated by applying an error correction value.

Embodiments of an apparatus for calculating a corrected ratio of two time increment values may include a ratio module, a multiplier, a subtraction module, an error correction module and an arithmetic module. The ratio module may be executed by a processor to calculate an uncorrected ratio between a first time increment value and a second time increment value. The multiplier may multiply the uncorrected ratio with the second time increment value to produce an uncorrected time increment value. The subtraction module may calculate an error value by subtracting the uncorrected time increment value from the first time increment value. The error correction module may produce an error correction value. The arithmetic module may update the uncorrected ratio by applying the error correction value to produce a corrected ratio.

In some embodiments, the present technology provides systems and methods for asynchronous sample rate conversion, allowing both arbitrary ratios between sample rates as well as time-varying arbitrary ratios between sample rates. Embodiments may add a time increment value to a current time register to produce a current time value, wherein the current time value includes a current time integer value and a current time fractional value. A starting address in a data table may be determined based on the current time integer value. Input values may be stored in the data table. Interpolation of coefficients related to a finite impulse response register may be performed to generate interpolated coefficients. A finite impulse response register may be configured from the interpolated coefficients. The finite impulse response filter may be a polyphase finite impulse response filter with multiple subphase components. Embodiments of a system for asynchronous sample rate conversion may include an adder that adds a time increment value to a current time register, wherein the current time register includes a current time integer value and a current time fractional value. A data table may be included, wherein a starting address is determined by a part of the current time register. A coefficient memory comprising coefficients related to a finite impulse response filter may be included, wherein a second starting address is determined by a second part of the current time register. An arithmetic unit may be included which produces interpolated coefficients, wherein the interpolation is controlled by a third part of the current time register. A finite impulse response filter configured from the interpolated coefficients may be included, which filters multiple entries of the data table to produce an output signal at a converted sample rate.

In some embodiments, the present technology provides system and methods for converting asynchronous sample rates. Embodiments may decimate an input signal to produce a first decimated signal. A decimated signal may be interpolated to produce an oversampled signal. A finite impulse response filter may be used to perform sample rate conversion on the oversampled signal to produce a converted output signal. Embodiments of a system for converting asynchronous sample rates may include a first decimator that decimates an input signal, an interpolator that interpolates a decimated signal, and a finite impulse response filter. Optionally, a second decimator may be included between the first decimator and the interpolator. Optionally, the output signal of the filter may be decimated again by a decimator and/or filtered through a guard band filter.

BRIEF DESCRIPTION OF THE DRAWINGS

FIG. 1B illustrates a block diagram of an exemplary clock ratio module.

FIG. 1C illustrates a block diagram of an exemplary ASRC system.

FIG. 2 illustrates a block diagram of an exemplary asynchronous sample rate conversion system.

DESCRIPTION OF EXEMPLARY EMBODIMENTS

The present technology achieves asynchronous sample rate conversion by mixing two sets of data streams that are clocked by independent asynchronous sources. Not only can these rates differ, but the lack of synchronization between the clocks may result in drift, for example 100 ppm. If one input stream has a higher rate than another stream, the process needs to effectively drop some samples and adjust the remaining samples to produce a high quality stream for mixing. If one input stream has a lower rate than another stream, the process needs to effectively insert additional samples (and usually copy and adjust the existing ones) to produce a high quality stream for mixing.

To calculate the ratio of two input clocks, a global high speed counter is used to create timestamps to label the arrival time of individual samples. At the instant a new audio sample is received, the value of the global counter is read and stored along with the incoming audio sample. This time of arrival measurement is called a "timestamp." The timestamps can also be stored at a lower rate than every sample. For example, time stamps can be collected every eight input samples, or every sixteen input samples. With multiple input streams, each set of input data has an associated set of timestamps. Because these timestamps are each referenced from the same counter, they can be used to calculate the differences in the sample rates of the different input streams. Usually, a sample rate of a digital audio data source is considered the base sample rate, and all other digital audio data sources are converted to the base sample rate.

A typical process of asynchronous sample rate conversion requires an accurate determination of the ratio between two clock signals, and a set of steps to convert the rate of one input stream to the rate of another stream.

Figure 1A:
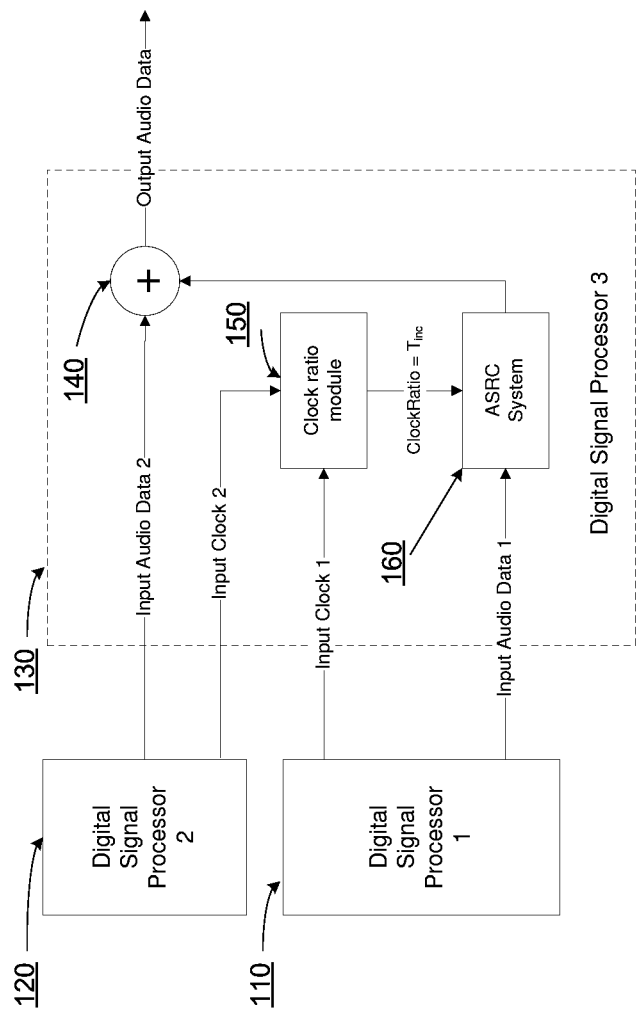
FIG. 1A illustrates a block diagram of an exemplary system which performs asynchronous sample rate conversion.

FIG. 1A illustrates a block diagram of an exemplary system which performs asynchronous sample rate conversion. Specifically, FIG. 1A incudes digital signal processor (DSP 1) 110, digital signal processor (DSP 2) 120, and digital signal processor (DSP 3) 130. DSP 3 includes clock ratio module and asynchronous ratio conversion (ASRC) system 160.

Input Clock 2 from DSP 120 and Input Clock 1 from DSP 110 are received by Clock ratio module 150. Clock ratio module calculates and outputs a corrected clock ratio (i.e., "time increment value") in system 100. ASRC system 160 receives the corrected clock ratio and input audio data signal 1 from DSP 1, converts input audio data stream 1 from DSP 110 into a data stream having a sampling rate matching that of the audio data stream from DSP 120 ("Input Audio Data 2"). Adder 140 may add the converted data stream output by ASRC System 160 and the data stream output by DSP 120 to produce an "Output Audio Data" stream, which may have little or no distortion. The output audio data stream may be processed further, for example by a Digital to Analog Convertor (DAC, not shown).

FIG. 1B illustrates a block diagram of an exemplary clock ratio module 150. Clock ratio module 150 may include ratio module 152, multiplier 154, subtraction module 156, error correction module 158, and arithmetic module 159. Ratio module 152 may calculate an uncorrected ratio, such as that derived from input clock 2 and input clock 1, between a first time increment value and a second time increment value. Multiplier 154 may multiply an uncorrected clock ratio with a second time increment value (such as a time increment value input clock 2) to produce an uncorrected time increment value. Subtraction module 156 may calculate an error value by subtracting the uncorrected time increment value from a first time increment value, such as the first time increment value. Error correction module 158 may produce an error correction value. Arithmetic module 159 may update the uncorrected ratio by applying an error correction value to produce a corrected clock ratio.

FIG. 1C illustrates a block diagram of an exemplary ASRC system. ASRC System 160 may include adder 162, data table 164, coefficient memory 166, arithmetic unit 168, and finite impulse response filter 169. Adder 162 may add a time increment value to a current time register, wherein the current time register includes a current time integer value and a current time fractional value. Data table 164 may store a starting address as determined from a value contained and received from a current time register, such as a portion of register 305 in FIG. 3. Coefficient memory 166 includes a portion of memory that stores coefficients related to a finite impulse response (FIR) filter. A second starting address of coefficient memory 166 may be based on a second portion of a current time register, such as register 325 in FIG. 3. Arithmetic unit 168 may produce interpolated coefficients, wherein the interpolation is controlled by a third part of the current time register. FIR filter 169 may be configured from interpolated coefficients and used to filter multiple entries of a data table to produce output data. Examples of ASRC system 160 are discussed in more detail below with respect to FIGS. 2 and 3.

Clock ratio module 150 receives input clocks from each of DSP 2 and DSP 1, generates an uncorrected clock ratio, determines an error value, and then generates a corrected clock ratio from the uncorrected ratio and error value. A clock ratio may be determined from sampling incoming data streams. The sampling rate of an incoming data stream can be determined by examining the difference between consecutive timestamps. For example, assume that a high speed counter runs at 240 MHz. If an incoming data stream has data points with timestamps arriving at 5000 count intervals per sample, then the sampling rate of this incoming data stream is calculated by dividing the counter rate by the difference between consecutive timestamps.

$$\frac{240 \text{ MHz}}{5000} = 48 \text{ kHz}$$

In order to resolve the difference between two asynchronous input sources, the present system may determine the ratio between the timestamps of the two input sources and perform additional processing based on the ratio. The ratio may be determined from the differences between consecutive timestamps of the different inputs. The difference between consecutive timestamps on one input may be defined as DeltaTimeInput1. The difference between consecutive timestamps on a second input may be defined as DeltaTimeInput2. The ratio between these two difference values is:

$$TimestampRatio = \frac{\Delta T2}{\Delta T1}$$

Where:

$\Delta T1$=DeltaTimeInput1;

$\Delta T2$=DeltaTimeInput2;

The time stamp ratio is used in the filtering portion of the asynchronous sample rate conversion process may be performed by ASRC system 160, and is called a time increment value, or $T_{inc}$. So, $$T_{inc} = \frac{\Delta T2}{\Delta T1} \quad \text{eq. 1}$$

Calculating the time increment by dividing DeltaTimeInput2 by DeltaTimeInput1 on a microprocessor or digital signal processor may induce error, at least due to the limited precision of typical division algorithms. A clock ratio with such errors may be corrected to produce a corrected ratio.

The error in a clock ratio may be represented in an equation as follows:

$$T_{inc}e = \frac{\Delta T2}{\Delta T1}e \quad \text{eq. 2}$$

where $T_{inc}e$=TimeIncrement with error. Alternatively:

$$T_{inc} = T_{inc}e + e_c \quad \text{eq. 3}$$

Where, $e_c$=error correction. The error correction value may be calculated by combining the information and equations given:

$$e_c = \frac{e}{\Delta T1}(\Delta T2 - T_{inc}e\Delta T1) \quad \text{eq. 4}$$

The error correction value may be applied according to the following equation to produce the corrected ratio:

$$T_{inc} = T_{inc}e + \frac{e}{\Delta T1}(\Delta T2 - T_{inc}e\Delta T1) \quad \text{eq. 5}$$

Hence, the $T_{inc}$ value is a corrected clock ratio that may not include much of the error contained in typical clock ratio calculations performed by a processor. A smoother module may process the corrected clock ratio, such as a low pass filter, for example to average out jitter. This efficient and direct calculation of the accurate time increment value allows immediate resolution of asynchronous clocks, enabling much faster lock times than with traditional PLL technologies, and at much lower power consumption.

Though much of the error is removed, the $T_{inc}$ value may still contain some residual error, which is relative to the magnitude of the error correction $e_c$. In practice, this error in the result is too small to be represented in the number of bits needed for an accurate ratio value, so no further error correction is required. Should more error correction be needed, eq. 5 can be computed recursively, by substitution of $T_{inc}e$ with the $T_{inc}$ output value. This process can be iterated until the desired accuracy is reached. The number of iterations can be fixed ahead of time to meet a pre-determined accuracy, or the process can be repeated until the final output value $T_{inc}$ is equivalent to the input value $T_{inc}e$.

The following pseudo-code illustrates an implementation of an exemplary clock ratio calculation algorithm that may be performed by clock ratio module 150.

```
static int PreviousTimeStamp1 = 0;
const int MAX_TIMESTAMP = 16777216; // 2^24
static int PreviousTimeStamp2 = 0;
float ClockRatioCalculation( int iNewTimeStamp1, int iNewTimeStamp2 )
{
    float DeltaTimeStamp1;          float InvDeltaTimeStamp1;
    float DeltaTimeStamp2;          float DeltaTimeStamp2WithError;
    float DeltaTimeStamp2Error;
    float TimeIncrement;            float TimeIncrementWithError;
    float ErrorCorrection;
    // Calculate the new Timestamp Deltas
    if( iNewTimeStamp1 > PreviousTimeStamp1) {
        DeltaTimeStamp1 = (float)(iNewTimeStamp1 - PreviousTimeStamp1);
    }
    else {
        DeltaTimeStamp1 = (float)(MAX_TIMESTAMP - (PreviousTimeStamp1 - iNewTimeStamp1));
    }
    if( iNewTimeStamp1 > PreviousTimeStamp1) {
        DeltaTimeStamp2 = (float)(iNewTimeStamp2 - PreviousTimeStamp2);
    }
    else {
        DeltaTimeStamp2 = (float)(MAX_TIMESTAMP - (PreviousTimeStamp2 - iNewTimeStamp2));
    }
    // Store new Timestamps for next call
    PreviousTimeStamp1 = iNewTimeStamp1;
    PreviousTimeStamp2 = iNewTimeStamp2;
    // Calculate the inverse of DeltaTimeStamp1 to create denominator
    InvDeltaTimeStamp1 = INV(DeltaTimeStamp1); // 1/x = INV(x);
    // Calculate TimeIncrementWithError
    TimeIncrementWithError = (DeltaTimeStamp2 * InvDeltaTimeStamp1);
    // Calculate DeltaTimeStamp2WithError
    DeltaTimeStamp2WithError = (TimeIncrementWithError * DeltaTimeStamp1);
    // Calculate DeltaTimeStamp2Error
    DeltaTimeStamp2Error = (DeltaTimeStamp2 - DeltaTimeStamp2WithError);
    // Calculate ErrorCorrection
    ErrorCorrection = (DeltaTimeStamp2Error * InvDeltaTimeStamp1);
    // Calculate final error-corrected TimeIncrement
    TimeIncrement = TimeIncrementWithError + ErrorCorrection;
    return(TimeIncrement);
}
```

ASRC system 160 of FIG. 1A may receive input audio data signal from DSP 1 and the corrected clock ratio signal from clock ratio module 150 and output a converted audio data signal. The converted audio data signal may represent the input audio data signal from DSP 1 but with a sampling rate that matches the input audio data signal provided by DSP 2. ASRC system 160 may be implemented in several ways. A basic ASRC system for use with a time varying clock ratio conversion is discussed below with respect to FIG. 2. An ASRC system utilizing polyphase filters and suitable for use with non-time varying clock ratio conversion is discussed below with respect to FIG. 3

FIG. 2 illustrates a block diagram of an exemplary asynchronous sample rate conversion system. The system of FIG. 2 performs sample rate conversion for arbitrary conversion ratios, which can also be time varying from sample to sample. This may be suitable for asynchronous sample rate conversion applications, where the conversion ratio is not known at design time, but rather is calculated by time stamp measurements of incoming sample rate streams. The system of FIG. 2 requires a large order FIR filter, which is expensive in CPU cycles and memory for large conversion ratios, such as 48,000 Hz to 8,000 Hz.

For typical high quality audio, where distortion components are more than 90 dB attenuated (and the pass band is flat to within 0.25 dB), the FIR filter may use at least 24 but more often 32 multiply-additions per output sample. In addition, the table of filter coefficients can be very large. Commercial implementations are as large as 8 megabytes of memory for the filter coefficients.

In low cost, low power embedded applications, the memory table size should be as small as possible, and the number of multiply-additions in the filter should be reduced as much as possible to decrease the computational load on the digital signal processor.

The system of FIG. 2 includes adder 220, current time register 230, and data table 240, interpolator 250. Current time register 230 may store the current time in the form of an integer value (portion of register labeled "CurTime Int") and a fractional value (portion of register labeled "CurTimeFraction"). The current time stored by current time register 230 may represent the current location in a waveform that being interpolated, and may represent a waveform point in between data samples of the original waveform. The entire fractional part defines the location in the waveform in between the input sample time instants that is being calculated.

Time Increment 210 is a corrected clock ratio and is added using Add 220 to the value of CurrentTime register 230 to produce the next location of the waveform to be calculated. The next location of the waveform to be calculated is then stored in the CurrentTime register 230. If, for example, the clock ratio between Input Clock 2 and Input Clock 1 (see FIG. 1A) is 1:2, i.e. the Time Increment value is 0.500, then the integer part of the CurrentTime register 230 increments by one for every other sample, and the fractional part alternates between 0 and 0.500. A simple implementation might be to duplicate every input sample to create the output values. Note that the input values, which may represent digital waveform data such as used for audio, are stored in Data table 240. Another implementation might interpolate, using Interpolator 250, new data values between each set of two consecutive input data values to be used as output data values.

Interpolator 250 may down sample (decimate) or up-sample (interpolate) a signal by a factor of M or L, respectively. To down-sample or decimate a signal x(n) by a factor M, signal x[n] may be band limited using a filter to 1/M of the original bandwidth. An example of a band-limiting filter may be a finite impulse response (FIR) filter or an infinite impulse response (IIR) filter. The band limitation may be utilized to avoid aliasing effects on output signal y[n] of interpolator 250. A decimation operation may then be performed which retains only every Mth sample of the input sequence. The samples not corresponding to an Mth sample may be discarded. Conversely, to up-sample or interpolate a signal by a factor L, interpolator 250 may add L−1 samples valued at zero for each input sample.

Unlike the system of FIG. 2, a ASRC with a polyphase filter may be useful for generating conversion ratios that are not time varying, and where the ratio can be expressed as a ratio of two integers, L/M. The polyphase based system may re-order filter coefficients into polyphase components for more efficient filter calculation. The present technology may perform asynchronous ratio conversion using polyphase filters for time varying arbitrary ratios. The polyphase-based ASRC provides significant advantages for implementation in hardware and in vector signal processors.

Figure 3:
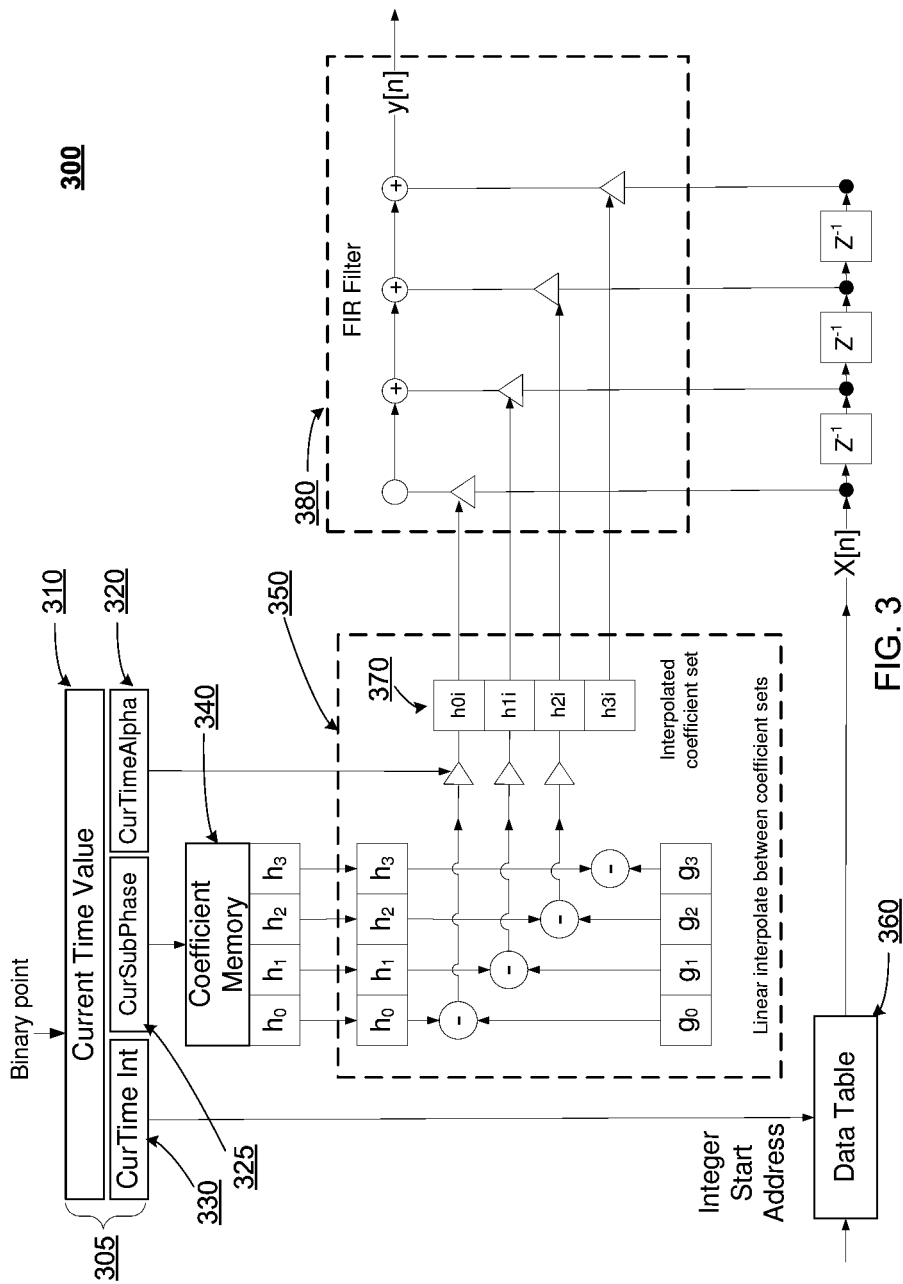
FIG. 3 illustrates a block diagram of an exemplary asynchronous sample rate conversion system that utilizes a polyphase filter.

FIG. 3 illustrates a block diagram of an exemplary asynchronous sample rate conversion system 300 that utilizes a polyphase filter. The system of FIG. 3 includes register 305, coefficient memory 340, interpolator 350, data table 360, and filter 380.

Register 305 is a current time value register. The current time value register may have an integer portion 330 (CurTime Int) and a fractional portion 320 (CurTimeAlpha). Data table 360 may store input digital audio waveform data at a starting address specified by the integer portion 330 of the current time value register. For example, the CurTimeInt field may be used as the starting address of a vector of four samples stored to and accessed from the data table 360. In some embodiments, data table 360 may include coefficient memory 340.

Current time value register 305 also includes a sub-phase portion 325 (CurSubPhase). In some embodiments, the fractional portion of the current time value in FIG. 2 may be divided into sub fields CurSubPhase and CurTimeAlpha.

The CurSubPhase field is used to retrieve a pair of four element vectors of filter coefficients from coefficient memory 340. These two sets of coefficients may be interpolated by interpolation module 350 using the CurTimeAlpha field of the current time value register. The interpolation method may be based on design choice, and may include for example linear, polynomial, and other interpolation methods.

Figure 4:
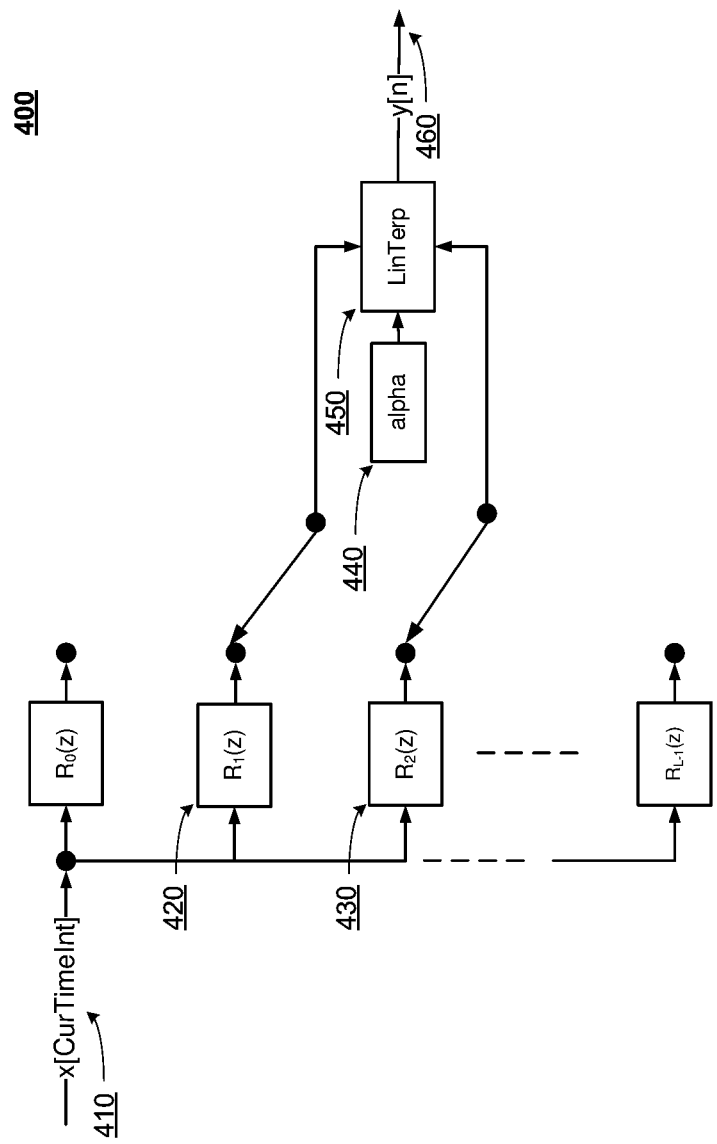
FIG. 4 illustrates a block diagram of an exemplary interpolation system.

Finally, the interpolated coefficients 370 are used in filter 380 to generate output values y[n] from input values X[n] in FIG. 4.

Filter 380 may be implemented as a FIR filter, for example a 4-point FIR filter, for interpolated polyphase filter sample rate conversion. A polyphase filter may be used for fixed-ratio sample rate conversion that avoids calculating sample values which may be decimated or that are zero. The polyphase equation (a.k.a. original prototype filter) is thus:

$$H(z) = \sum_{n=-\infty}^{\infty} h(n)z^{-n},$$

wherein z represents a delay of one sample.

This summation can be grouped together in two parts, for the simplest polyphase filter with only two sub-phases:

$$H(z)=[\ldots +h(-4)z^4+h(-2)z^2+h(0)+h(2)z^{-2}+h(4)z^{-4}+\ldots ]+z^{-1}[\ldots +h(-3)z^4+h(-1)z^2+h(1)+h(3)z^{-2}+\ldots]$$

In the two parts of the polyphase equation, even output samples are computed in a first portion and even output samples are computed in a second portion. These portions may be named $E0(z^2)$ and $E1(z^2)$ and are commonly referred to as polyphase components or sub-phases. The coefficients in each sub-phase are the even and odd components of the original prototype filter.

There are two forms of polyphase filter. A type 1 polyphase filter is most applicable to decimation (decreasing the sample rate). A type 2 polyphase filter is most applicable to interpolation (increasing the sample rate). Type 1 is characterized as $$H(z)=E_0(z^2)+z^{-1}E_1(z^2),$$

while Type 2 is characterized as $$H(z)=R_1(z^2)+z^{-1}R_0(z^2),$$

A decimation filter consists of a Type 1 filter followed by a decimation operation (or decimator). Some of the samples computed by the Type 1 filter may be subsequently thrown away by the decimator. The decimator may be positioned before the Type 1 filter, such that the filter can run at the lower rate (e.g. half rate in case of a so-called half band decimator). No samples are being computed that are then thrown away with this method. Hence, odd output samples may use odd samples of the filter impulse response, and even output samples may use even samples of the filter impulse response. Similarly, for Type 2 filters, the interpolation operation can be moved in front of the filter and the delay of $Z^2$ can be replaced by Z. This may prevent filtering of trivial values. The filter may run at a lower rate than the input sample rate. For a so-called half band interpolator, the filter takes half of the work to compute, which saves power and CPU cycles.

The output of the polyphase sub filters may be treated as a commutator, where odd samples are interleaved with even samples to generate the final output data stream y[n]. A polyphase filter may generalize to an arbitrary number of sub phases. Any number of sub-phases may be implemented, such as for example, 16, 32 or 64 sub-phases. The number of sub phases in a traditional polyphase filter may be determined by the sample rate conversion ratio, which may be treated as a fixed ratio. The present technology interpolates between polyphase components to allow time-varying, arbitrary sample rate conversion ratios.

Interpolator 350 may access coefficients from coefficient memory 340, which may be within data table 360. Since the coefficients are stored in polyphase form, memory access can be in vectors of more than one sample. For example, a first vector of four coefficients (h0,h1,h2,h3) can be read from memory in a single cycle. A second vector, labeled g0, g1, g2, g3, can be read in one cycle. The pair of vectors can be interpolated in one cycle using four multiply-adders. In a non-polyphase filter implementation, it is necessary to calculate four addresses and to perform four separate memory accesses for each set of four coefficients, which is less efficient and consumes more power.

The size of a FIR SRC filter table may be decreased along with the required number of multiply-additions by using a multi-stage sample rate conversion method. A multi-stage sample rate conversion method generates an oversampled signal which may be output and received into a following sample rate conversion stage. When converting from a high sample rate F1, such as for example a high sample rate of 16,000 Hz, down to a lower sample rate, such as for example F2=8,000, an oversampled signal may be generated by filtering the input signal and oversampling the filtered signal. Input signal S1 is filtered at input sample rate F1 with a low pass filter LPF1, with a cutoff frequency of $$\frac{F_1}{4}$$

and a very low stop band. The filtering removes at least a portion of the energy above frequency $$\frac{F_1}{4},$$

creating intermediate signal S2. Signal S2 is over-sampled by a factor of two, such that there may be no energy above $$\frac{F_1}{4}.$$

Oversampled signal S2 may be provided to a FIR sample rate convertor (SRC). The FIR SRC can now be much simpler, at least because the signal S2 allows a large transition band in the design of the filter for the FIR SRC. The low pass filter LPF1 runs at the high sample rate F1, and all calculations for the digital filter LPF1 happen at the high sample rate F2. Therefore, the filter consumes more cycles to perform calculations, which in turn implies higher power consumption.

An oversampled signal S2 may also be generated using halfband sample rate converters, which can run at the lower sample rate, F2, instead of the high sample rate F1. Using a halfband sample rate converter to generate an oversampled signal may begin with down-sampling the input signal S1 at rate F1 by a decimation factor M=2. The down sampling may be performed using an IIR decimation algorithm, creating signal Si. The IIR decimation algorithm may be clocked at the low sample rate F2. Signal Si may be up-sampled by an interpolation factor L=2 using a highly efficient IIR interpolator, which may by clocked at rate F2, to create signal S2. Signal S2 may be oversampled by a factor of two, allowing a much simpler FIR SRC algorithm to provide high quality audio sample rate conversion. The computation cost for equivalent quality filter specifications may be less using the decimation and interpolation operations than for using the original filter LPF1 running at the high sample rate F1.

An efficient method to implement a sample rate change by two, either to increase or to decrease the sample rate, may be to use IIR all pass filters. A half band decimator decreases the sample rate by a factor two while a half band interpolator increases the sample rate by a factor two. A polyphase half band decimator can be clocked to execute at the lower sample rate, reducing power usage. The even samples of X[m] are fed into a filter H1(z) and the odd samples of X[m] are fed into H0(z). The outputs of H0(z) and H1(z) are added together, sample by sample, and then scaled by one half to generate the output signal, which is at half the sample rate of the input, X[m].

All pass filters H0 and H1 can be implemented as a cascade of first order IIR all pass filters. They can also be implemented as FIR all pass filters, but IIR all pass filters are simpler to compute and require fewer cycles to compute. There are many different ways to implement first order all pass filters. A polyphase half band interpolator can be constructed using similar all pass filters as building blocks. Multi-stage sample rate conversion allows a larger transition band in the filter design. The larger transition band can greatly decrease the length of the asynchronous sample rate conversion filter, which decreases computational and memory requirements.

By decimating by two or four, and interpolating back up by two, a signal is obtained that is oversampled by two. The oversampled signal allows for a much shorter FIR filter and fewer coefficients need be stored for the FIR filter. The same result can be accomplished using a filter operating at the original sample rate, but at a higher computational and memory cost. Decimation can be accomplished at the lower sample rate using a polyphase IIR filter. Some known methods filter a 48,000 Hz signal with a low pass filter in order to obtain an oversampled signal. The present technology discloses using a decimator and then an interpolator to accomplish the lowpass filter function for oversampling. Using a decimator and interpolator is more efficient for this function of generating an oversampled signal.

FIG. 4 illustrates a block diagram of an exemplary interpolation system. System 400 of FIG. 4 includes interpolation (by Interpolator 450, labeled LinTerp in FIG. 4) of coefficients for a polyphase finite impulse response filter with L sub-phases. Input signal x[n] (labeled 410 in FIG. 4) is thus converted to output signal y[n] (labeled 460 in FIG. 4). Input signal x[n] could come from a data table (not shown in FIG. 4). In this example, the coefficients for sub-phases R1 (labeled 420 in FIG. 4) and R2 (labeled 430 in FIG. 4) are currently interpolated, but any set of two consecutive sub-phases (from 0 to L−1) may be used of course. The coefficients for sub-phases R1 and R2 could come from a coefficient memory, such as Coefficient Memory 340 in FIG. 3. For example, the coefficients 420 for sub-phase R1 in FIG. 4 could be the same as coefficients h0, h1, h2, and h3 inside interpolation module 350 in FIG. 3. Coefficients 430 for sub-phase R2 in FIG. 4 could be the same as coefficients g0, g1, g2, and g3 inside interpolation module 350 in FIG. 3. In FIG. 4, alpha 440, which may be (part of) the fractional part of a time register, controls the interpolation. An example of alpha 440 may be CurTimeAlpha 320 in FIG. 3. Interpolator 450 in FIG. 4 is shown in more detail in FIG. 3, as the combination of interpolation module 350 and FIR filter 380, which together produce output signal y[n]. Output y[n] is shown in both FIG. 4 and FIG. 3.

Figure 5:
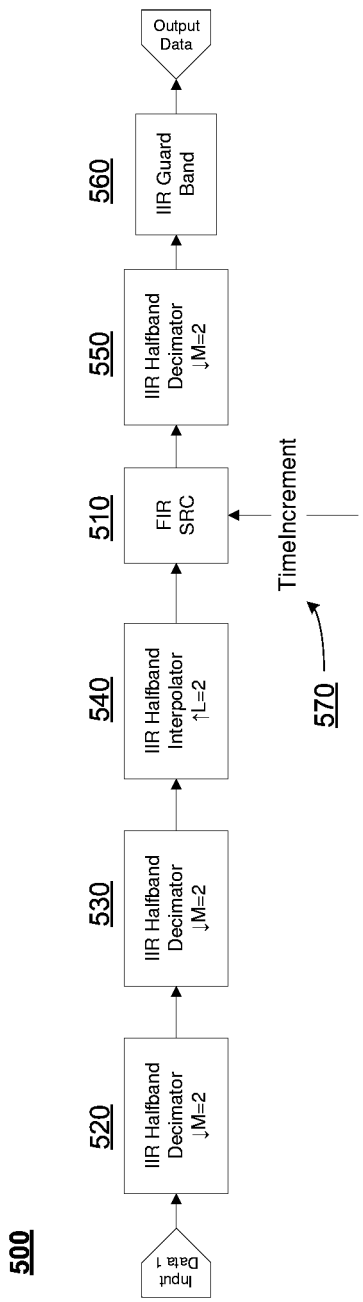
FIG. 5 illustrates a diagram of a stages performed during asynchronous sample rate conversion.

FIG. 5 illustrates a diagram of a stages performed during asynchronous sample rate conversion. An input signal enters halfband decimator 520, and is optionally decimated again by a halfband decimator 530. The decimated signal may be interpolated by halfband interpolator 540 before entering a FIR filter 510 that implements sample rate conversion using a TimeIncrement value (labeled 570 in FIG. 5). Optionally, the output signal of FIR filter 510 may be decimated by halfband decimator 550 and/or filtered by guard band filter 560 to produce the output data of system 500.

Figure 6A:
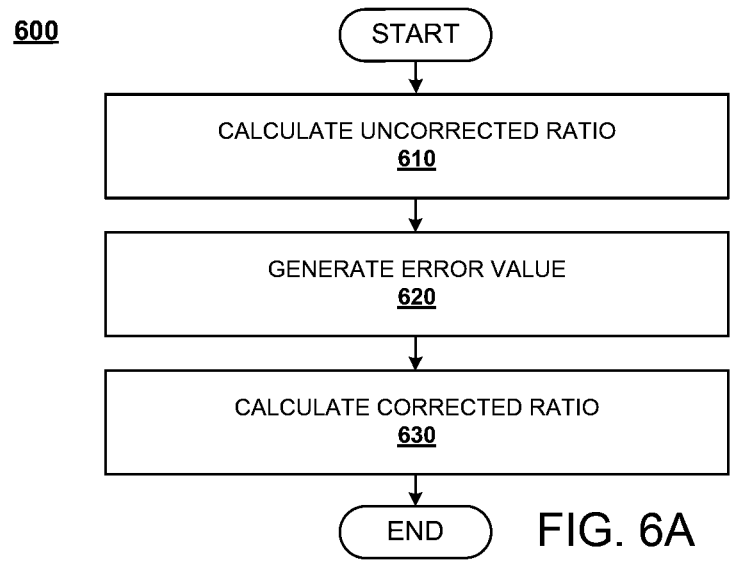
FIG. 6A illustrates a flow chart of an exemplary method for calculating a corrected ratio of two time increment values.

FIG. 6A illustrates a flow chart of an exemplary method 600 for calculating a corrected ratio of two time increment values. The method of FIG. 6A may be performed by clock ratio module 150. An uncorrected clock ratio is calculated at step 610. The uncorrected clock ratio is generated from multiple samples from each of input clock 2 and input clock 1 output by DSP 2 and DSP 1, respectively. An error value is produced at step 620. The corrected clock ratio is generated by applying the error correction value to the uncorrected clock ratio at step 630.

Figure 6B:
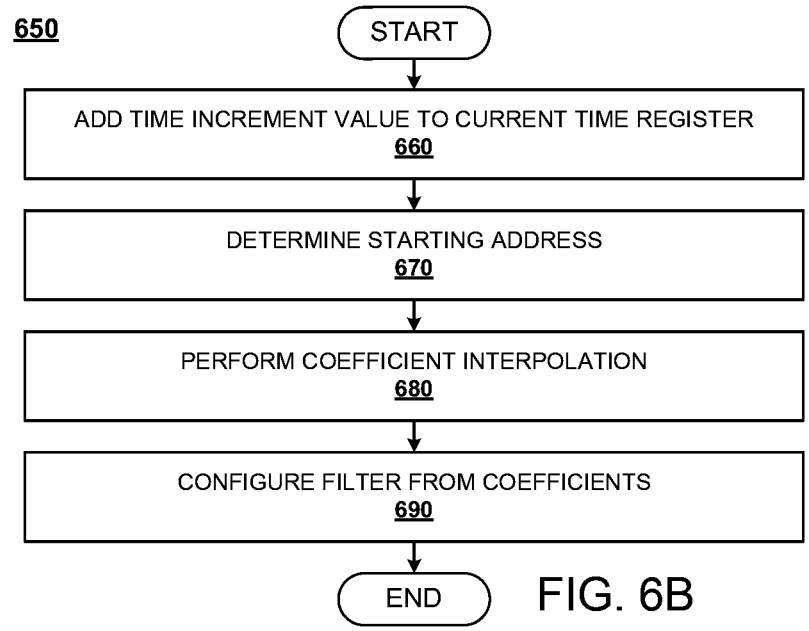
FIG. 6B illustrates a flow chart of an exemplary method for asynchronous sample rate conversion.

FIG. 6B illustrates a flow chart of an exemplary method 650 for asynchronous sample rate conversion. The method of FIG. 6B may be performed by ASRC system 160. A time increment value may be added to a current time register at step 660. A starting address may be determined based on the value of the current time register at step 670. The starting address may be stored within a data table accessible or within ASRC system 160. Coefficient interpolation may be performed at step 680. The coefficients may be related to sub-phases components of a polyphase filter, such as a polyphase FIR filter. A filter may be configured from the interpolated coefficients at step 690.

Figure 7:
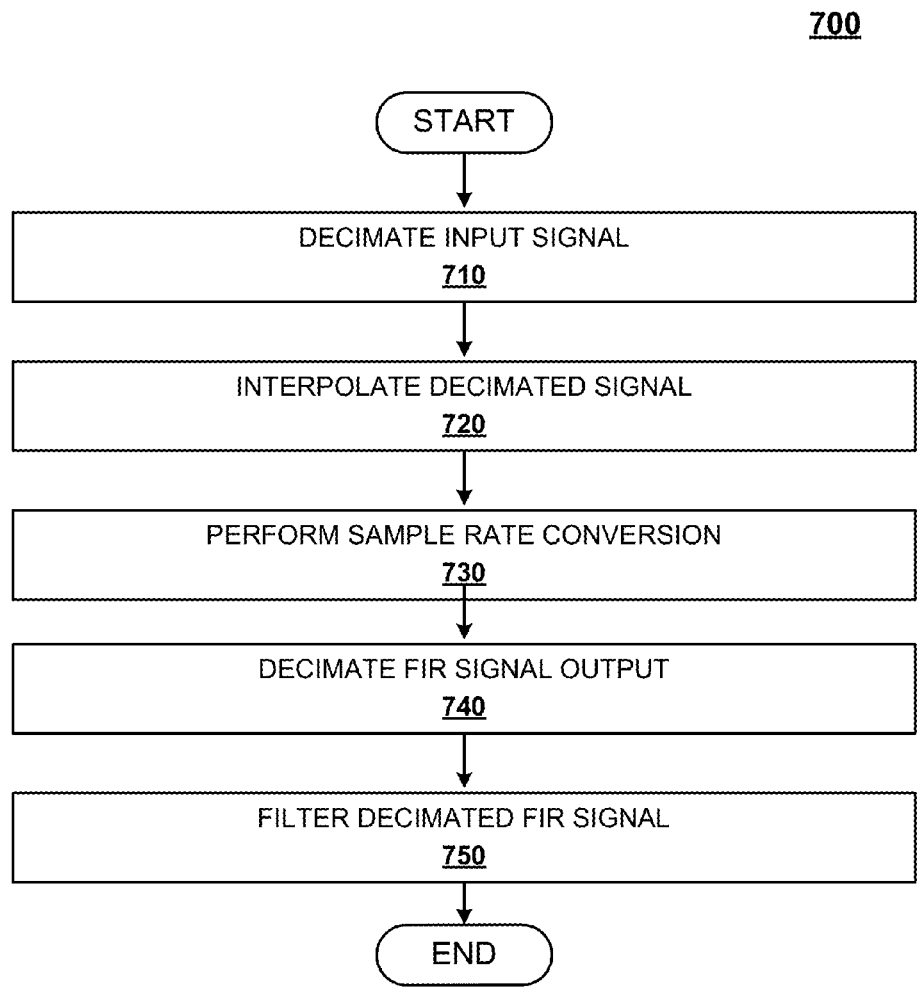
FIG. 7 illustrates a flow chart of an exemplary method for asynchronous sample rate conversion.

FIG. 7 illustrates a flow chart of an exemplary method 700 for asynchronous sample rate conversion. An input signal is decimated at step 710. The decimation step may be performed one or more times. The decimated signal may be interpolated at step 720. The interpolation may be a linear interpolation or some other form of interpolation. A filter such as a FIR filter may be used to perform sample rate conversion using the interpolated signal at step 730. The output of the FIR filter may be decimated at step 740. The decimated FIR filter may be filtered through a guard band filter at step 750.

Figure 8:
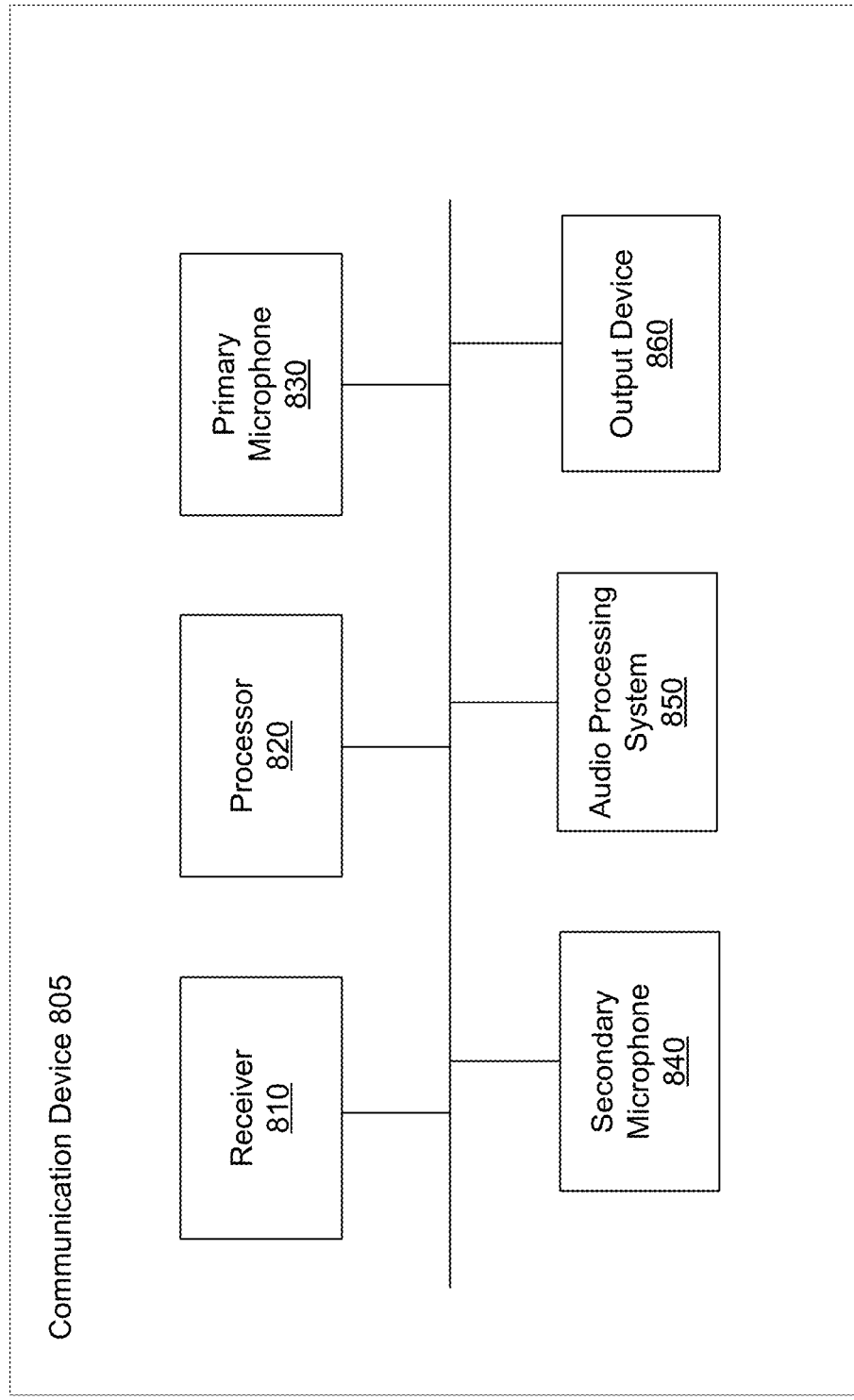
FIG. 8 illustrates a block diagram of a communication device implementing embodiments of the present technology.

FIG. 8 illustrates a block diagram of a communication device 805 implementing embodiments of the present technology. In exemplary embodiments, the communication device 805 is an audio receiving device that comprises a receiver 810, a processor 820, the primary microphone 830, a secondary microphone 840, the audio processing system 850, and an output device 860. The communication device 805 may comprise more or other components necessary for communication device 805 operations. Similarly, the communication device 805 may comprise fewer components that perform similar or equivalent functions to those depicted in FIG. 8.

Processor 820 may include hardware and software which implements the processing unit described above. The processing unit may process floating point operations and other operations for the processor 820.

The exemplary receiver 810 is an acoustic sensor configured to receive a signal from a (communication) network. In some embodiments, the receiver 810 may comprise an antenna device. The signal may then be forwarded to the audio processing system 850 and then to the output device 860. For example, audio processing system 850 may include the present technology. The present technology may be used to mix audio streams in both the transmit and receive paths of a communication device.

The audio processing system 850 may furthermore be configured to receive the acoustic signals from an acoustic source via the primary and secondary microphones 830 and 840 (e.g., primary and secondary acoustic sensors) and process the acoustic signals. The primary and secondary microphones 830 and 840 may be spaced a distance apart in order to allow for an energy level differences between them. After reception by the microphones 830 and 840, the acoustic signals may be converted into electric signals (i.e., a primary electric signal and a secondary electric signal). The electric signals may themselves be converted by an analog-to-digital converter (not shown) into digital signals for processing in accordance with some embodiments. In order to differentiate the acoustic signals, the acoustic signal received by the primary microphone 830 is herein referred to as the primary acoustic signal, while the acoustic signal received by the secondary microphone 840 is herein referred to as the secondary acoustic signal. It should be noted that embodiments of the present invention may be practiced utilizing any plurality of microphones/audio sources. In exemplary embodiments, the acoustic signals from output device 860 may be included as part of the (primary or secondary) acoustic signal. The primary acoustic signal and the secondary acoustic signal may be processed by audio processing system 850 to produce a signal with an improved signal to noise ratio for transmission across a communications network and/or routing to the output device. Additional audio source for audio processing system

850 may be generated internally to communication device 805, for example by a user interface (or media interface) that runs on processor 820.

The output device 860 may be any device which provides an audio output to a listener (e.g., an acoustic source). For example, the output device 860 may comprise a speaker, an earpiece of a headset, or handset on the communication device 805.

Embodiments of the present invention may be practiced on any device that is configured to receive and/or provide audio such as, but not limited to, cellular phones, phone handsets, headsets, and systems for teleconferencing applications.

Some or all of the above-described modules can be comprised of instructions that are stored on storage media. The instructions can be retrieved and executed by the processor 820. Some examples of instructions include software, program code, and firmware. Some examples of storage media comprise memory devices and integrated circuits. The instructions are operational when executed by the processor 820 to direct the processor 820 to operate in accordance with embodiments of the present invention. Those skilled in the art are familiar with instructions, processor(s), and (computer readable) storage media.

The present technology is described above with reference to exemplary embodiments. It will be apparent to those skilled in the art that various modifications may be made and other embodiments can be used without departing from the broader scope of the present technology. For example, embodiments of the present invention may be applied to any system (e.g., non speech enhancement system) utilizing AEC. Therefore, these and other variations upon the exemplary embodiments are intended to be covered by the present invention.

The invention claimed is:

1. A method for asynchronous sample rate conversion, comprising:
    adding a time increment value to a current time register to produce a current time value, wherein the current time value includes a current time integer value and a current time fractional value;
    determining a starting address in a data table based on the current time integer value;
    performing interpolation of coefficients related to a finite impulse response filter to generate interpolated coefficients; and
    configuring a finite impulse response filter from the interpolated coefficients.

2. The method of claim 1, wherein the coefficients are retrieved from a coefficient memory.

3. The method of claim 2, wherein the most significant bits of the current time fractional value are used to determine a starting address in the coefficient memory, and wherein the remaining bits of the current time fractional value are used to control the interpolation.

4. The method of claim 1, wherein the finite impulse response filter uses polyphase components.

5. The method of claim 1, wherein digital waveform data is stored in the data table.

6. The method of claim 1, wherein the starting address addresses a vector of multiple samples in the data table.

7. The method of claim 1, wherein the finite impulse response filter filters multiple entries of the data table.

8. A system for asynchronous sample rate conversion, comprising:
    an adder which adds a time increment value to a current time register, wherein the current time register includes a current time integer value and a current time fractional value;
    a data table, wherein a starting address is determined by a part of the current time register;
    a coefficient memory comprising coefficients related to a finite impulse response filter, wherein a second starting address is determined by a second part of the current time register;
    an arithmetic unit which produces interpolated coefficients, wherein the interpolation is controlled by a third part of the current time register; and
    a finite impulse response filter configured from the interpolated coefficients which filters multiple entries of the data table.

9. The system of claim 8, wherein the finite impulse response filter uses polyphase components.

10. The system of claim 8, wherein the most significant bits of the current time fractional value are used to determine the second starting address, and wherein the remaining bits of the current time fractional value are used to determine the third part of the current time register.

11. A non-transitory computer readable storage medium having embodied thereon a program, the program being executable by a processor to perform a method for asynchronous sample rate conversion, comprising:
    adding a time increment value to a current time register to produce a current time value, wherein the current time value includes a current time integer value and a current time fractional value;
    determining a starting address in a data table based on the current time integer value;
    performing interpolation of coefficients related to a finite impulse response filter to generate interpolated coefficients; and
    configuring a finite impulse response filter from the interpolated coefficients.

12. The non-transitory computer readable storage medium of claim 11, wherein the coefficients are retrieved from a coefficient memory.

13. The non-transitory computer readable storage medium of claim 11, wherein the finite impulse response filter uses polyphase components.

14. The non-transitory computer readable storage medium of claim 11, wherein digital waveform data is stored in the data table.

15. The non-transitory computer readable storage medium of claim 11, wherein the starting address addresses a vector of multiple samples in the data table.

16. A method for calculating a corrected ratio of two time increment values, comprising:
    calculating an uncorrected ratio between a first time increment value and a second time increment value;
    producing an error value by subtracting an uncorrected increment value from the second time increment value; and
    updating the uncorrected ratio by applying an error correction value.

17. The method of claim 16, wherein the uncorrected increment value is determined by multiplying the first time increment value with the uncorrected ratio.

18. The method of claim 16, wherein the error correction value is determined by multiplying the error value with an inverse of the second time increment value.

19. An apparatus for calculating a corrected ratio of two time increment values, comprising:

a ratio module executed by a processor to calculate an uncorrected ratio between a first time increment value and a second time increment value;

a first multiplier which multiplies the uncorrected ratio with the second time increment value to produce an uncorrected time increment value;

a first subtraction module which calculates an error value by subtracting the uncorrected time increment value from the first time increment value;

an error correction module which produces an error correction value; and an arithmetic module which updates the uncorrected ratio by applying the error correction value to produce a corrected ratio.

20. The apparatus of claim 19, wherein the ratio module comprises:

a second subtraction module which calculates a first time increment value between consecutive arrival times of samples of a first data stream sampled at a first clock rate;

a third subtraction module which calculates a second time increment value between consecutive arrival times of samples of a second data stream sampled at a second clock rate; and a second arithmetic module which produces an uncorrected ratio based on the first time increment value and the second time increment value.

21. The apparatus of claim 20, wherein the second arithmetic module comprises:

an inverter which calculates the inverse of the second time increment value; and a second multiplier which multiplies the inverse of the second time increment value with the first time increment value to produce an uncorrected ratio.

22. The apparatus of claim 19, wherein the error correction module comprises another multiplier which multiplies the error value with the inverse of the second time increment value to produce the error correction value.

\* \* \* \* \*